United States Patent [19]

Lee

[11] Patent Number: 5,866,482
[45] Date of Patent: Feb. 2, 1999

[54] METHOD FOR MASKING CONDUCTING LAYERS TO ABATE CHARGE DAMAGE DURING PLASMA ETCHING

[75] Inventor: Jian-Huei Lee, Hsin-Chu, Taiwan

[73] Assignee: Taiwan Semiconductor Manufacturing Company, Ltd., Hsin-Chu, Taiwan

[21] Appl. No.: 721,669

[22] Filed: Sep. 27, 1996

[51] Int. Cl.$^6$ .................... H01L 21/3065; H01L 21/027
[52] U.S. Cl. ................ 438/720; 438/597; 438/669; 438/926
[58] Field of Search ................... 438/926, 669, 438/720, 597, 622, 707, 709, 710, 712, 719, 742

[56] References Cited

U.S. PATENT DOCUMENTS

| | | | |
|---|---|---|---|
| 5,049,514 | 9/1991 | Mori | 438/301 |
| 5,393,701 | 2/1995 | Ko et al. | 438/612 |
| 5,441,915 | 8/1995 | Lee | 437/195 |
| 5,767,006 | 6/1998 | Lee | 438/597 |
| 5,770,518 | 6/1998 | Shen | 438/631 |

*Primary Examiner*—John F. Niebling
*Assistant Examiner*—Ha Tran Nguyen
*Attorney, Agent, or Firm*—George O. Saile; Stephen B. Ackerman; Alek P. Szecsy

[57] ABSTRACT

A method for forming within an integrated circuit a patterned conductor layer from a blanket conductor layer through a plasma etch method, where there is simultaneously avoided plasma induced electrical discharge damage to an integrated circuit structure formed beneath the blanket conductor layer. There is first provided a substrate. There is then formed over the substrate an integrated circuit structure. There is then formed over the substrate and the integrated circuit structure a blanket conductor layer. There is then formed upon the blanket conductor layer a patterned photoresist layer, where the patterned photoresist layer simultaneously: (1) leaves unexposed a first portion of the blanket conductor layer sufficiently large, and (2) leaves exposed a second portion of the blanket conductor layer sufficiently small, to limit plasma induced electrical discharge damage to the integrated circuit structure when the blanket conductor layer is patterned to form a patterned conductor layer through a plasma etch method. Finally, there is etched through the plasma etch method while employing the patterned photoresist layer as an etch mask layer the blanket conductor layer to form the patterned conductor layer.

14 Claims, 5 Drawing Sheets

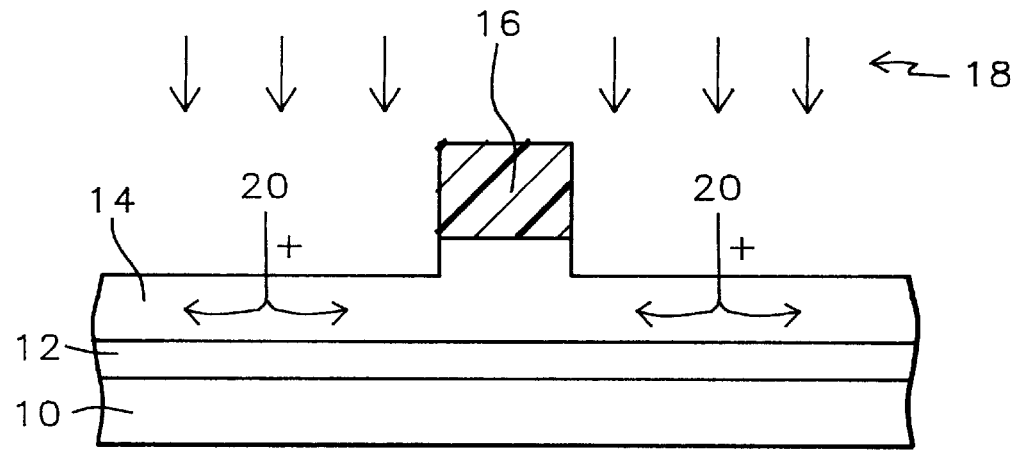
FIG. 1 – Prior Art
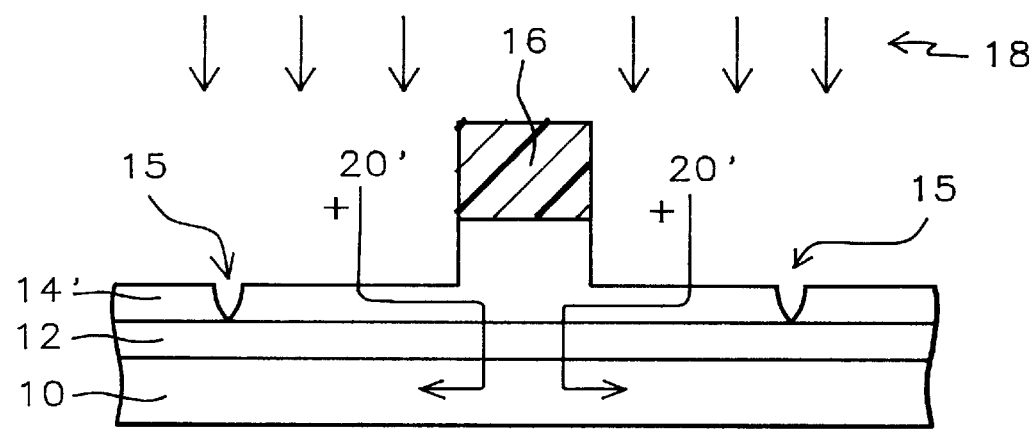
FIG. 2 – Prior Art
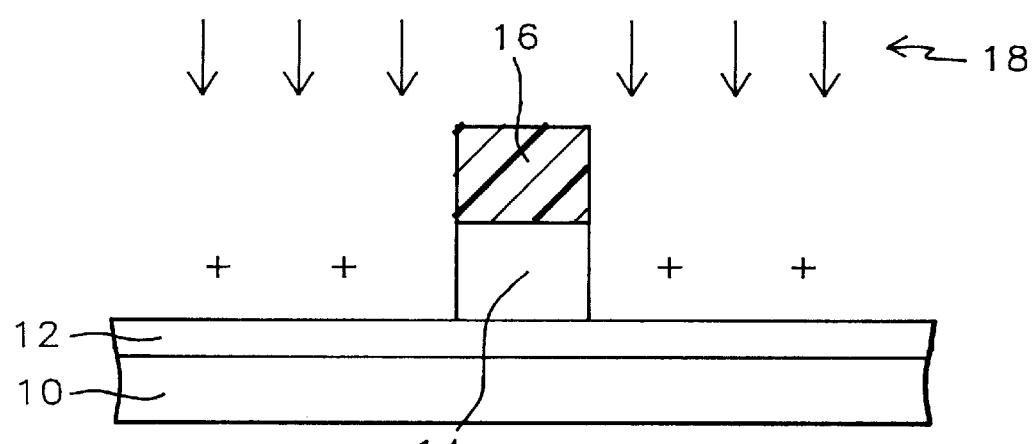
FIG. 3 – Prior Art

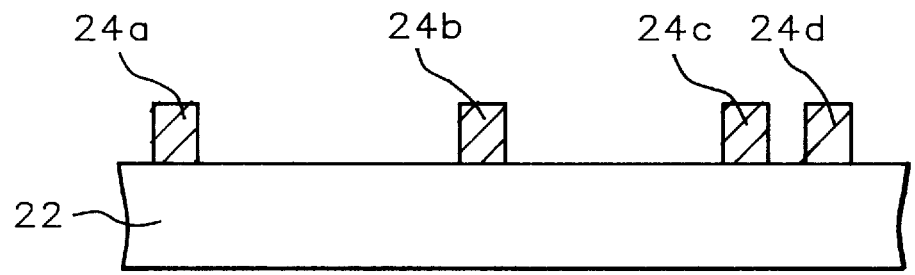
*FIG. 4 - Prior Art*
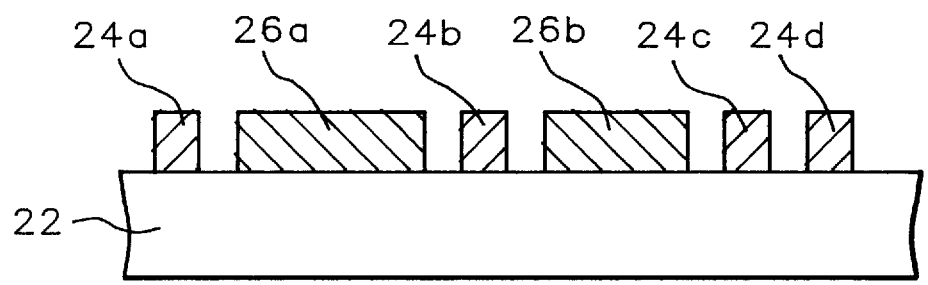
*FIG. 5*

5,866,482

METHOD FOR MASKING CONDUCTING LAYERS TO ABATE CHARGE DAMAGE DURING PLASMA ETCHING

BACKGROUND OF THE INVENTION

1. Field of the Invention

The present invention relates generally to methods for forming patterned conductor layers within integrated circuits. More particularly, the present invention relates to a masking method employed in forming through a plasma etch method within an integrated circuit a patterned conductor layer from a blanket conductor layer, where the masking method avoids plasma induced electrical discharge damage to integrated circuit structures, such as but not limited to integrated circuit layers and integrated circuit devices, formed beneath the blanket conductor layer.

2. Description of the Related Art

When employing plasma etch methods, such as but not limited to microwave plasma etch methods, reactive ion etch (RIE) plasma etch methods, magnetically enhanced reactive ion etch (MERIE) plasma etch methods and electron cyclotron resonance (ECR) plasma etch methods, for etching a blanket conductor layer to form a patterned conductor layer within an integrated circuit, it is known in the art of integrated circuit fabrication that the blanket conductor layer and any other integrated circuit layers exposed to the plasma etch method will typically become electrically charged incident to exposure of the blanket conductor layer to the plasma employed within the plasma etch method. Blanket conductor layers are typically particularly susceptible to electrical charging within a plasma etch method employed in forming patterned conductor layers from those blanket conductor layers since electrical charge formed upon a blanket conductor layer may be readily concentrated and redistributed over large areas of a blanket conductor layer due to the conductive character of the blanket conductor layer.

While the phenomenon of electrical charge generation within blanket conductor layers incident to patterning those blanket conductor layers to form patterned conductor layers through plasma etch methods is known in the art, the phenomenon of electrical charge generation within blanket conductor layers incident to patterning those blanket conductor layers through plasma etch methods is nonetheless problematic. The phenomenon of electrical charge generation is particularly problematic under circumstances where a patterned conductor layer of narrow linewidth is desired to be formed from a blanket conductor layer. Under such circumstances, the electrical charge generated within the blanket conductor layer becomes exceedingly dense as the blanket conductor layer is patterned to form the narrow linewidth patterned conductor layer. Under circumstances where the narrow linewidth patterned conductor layer so formed adjoins directly or indirectly a dielectric layer or other integrated circuit layer of limited dielectric capacity, an electrical discharge may occur through the dielectric layer or other integrated circuit layer of limited dielectric capacity while patterning the blanket conductor layer to form the narrow linewidth patterned conductor layer. Such an electrical discharge may often damage the dielectric layer, other integrated circuit layer or integrated circuit structures formed beneath the blanket conductor layer.

A particularly common example where damage may occur to an adjoining dielectric layer when patterning a blanket conductor layer to form a patterned conductor layer is encountered when patterning a blanket gate electrode material layer formed upon a blanket gate dielectric layer when forming for use within a field effect transistor (FET) a gate electrode from the blanket gate electrode material layer. A series of schematic cross-sectional diagrams illustrating a proposed mechanism through which such damage may occur is illustrated by reference to FIG. 1 to FIG. 3.

Shown in FIG. 1 is a semiconductor substrate 10 having formed thereupon a blanket gate dielectric layer 12. Formed upon the blanket gate dielectric layer 12 is a partially patterned gate electrode material layer 14 which is being patterned through a plasma etch method employing a plasma 18 and a patterned photoresist layer 16. As is shown in FIG. 1, since the partially patterned gate electrode material layer 14 is formed from a blanket conductor layer, the directions of charge flow and dissipation 20 from the plasma 18 are within the partially patterned gate electrode material layer 14 both towards and away from the patterned photoresist layer 16.

As is shown in FIG. 2, upon further patterning of the partially patterned gate electrode material layer 14 within the plasma 18 there is formed a further partially patterned gate electrode material layer 14'. The further partially patterned gate electrode material layer 14' is of sufficiently limited thickness such that breaks 15 form within the further partially patterned gate electrode material layer 14' forcing plasma induced electrical charge to redistribute within the further partially patterned gate electrode material layer 14' and lead to a direction of charge flow and dissipation 20' from the plasma 18 which is no longer exclusively within the further partially patterned gate electrode material layer 14'. Rather, the direction of charge flow and dissipation 20' from the plasma 18 is sequentially through: (1) the thicker portion of the further partially patterned gate electrode material layer 14' beneath the patterned photoresist layer 16; and (2) the portion of the blanket gate dielectric layer 12 beneath the patterned photoresist layer 16, resulting ultimately in charge flow and dissipation into the semiconductor substrate 10. Under circumstances where substantial quantities of charge flow and are dissipated through the direction of charge flow and dissipation 20' as illustrated in FIG. 2, damage may occur to the portion of the blanket gate dielectric layer 12 formed beneath the patterned photoresist layer 16.

Finally, as is shown in FIG. 3, when the further partially patterned gate electrode material layer 14' has been completely patterned to yield the gate electrode 14a, there is no longer any charge flow and dissipation through the portion of the blanket gate dielectric layer 12 formed beneath the gate electrode 14a and consequently also no additional damage to the portion of the blanket gate dielectric layer 12 formed beneath the gate electrode 14a.

Although FIG. 1 to FIG. 3 illustrate the charges formed incident to patterning the partially patterned gate electrode material layer 14 as positive charges, it is theoretically possible, although in practice typically not preferred, that there may alternatively be formed negative charges within a partially patterned conductor layer, such as the partially patterned gate electrode material layer 14, when the partially patterned conductor layer is patterned to form a patterned conductor layer through a plasma etch method employing a plasma such as the plasma 18. The presence of either positive or negative charges within the partially patterned conductor layer is typically largely determined by the polarity of an electrical bias applied to a semiconductor substrate, such as the semiconductor substrate 10, over which is formed the partially patterned conductor layer, since plasmas employed within plasma etch methods will typically have formed therein substantial quantities of both positive and negative charged species.

Thus, it is towards the goal of limiting within integrated circuits plasma induced electrical discharge damage to integrated circuit structures, such as but not limited to integrated circuit layers and integrated circuit devices, formed beneath blanket conductor layers when those blanket conductor layers are patterned to form patterned conductor layers through plasma etch methods, that the present invention is generally directed.

In that regard, methods through which conductor layers may be modified to provide desired properties within integrated circuits are known in the art of integrated circuit fabrication. For example, Lee in U.S. Pat. No. 5,441,915 discloses a method for fabricating a planarized conductor metallurgy structure for a semiconductor device within an integrated circuit, where the planarized conductor metallurgy structure employs dummy metal lines to fill gaps which would otherwise provide a conductor metallurgy structure which is not readily planarized.

Desirable in the art are methods through which there may be avoided within integrated circuits plasma induced electrical discharge damage to integrated circuit structures, such as but not limited to integrated circuit layers and integrated circuit devices, formed beneath blanket conductor layers when those blanket conductor layers are patterned to form patterned conductor layers through plasma etch methods. Particularly desirable are methods through which there may be avoided plasma induced electrical discharge damage to gate dielectric layers formed beneath blanket gate electrode material layers when those blanket gate electrode material layers are patterned to form gate electrodes through plasma etch methods. It is towards these goals that the present invention is specifically directed.

SUMMARY OF THE INVENTION

A first object of the present invention is to provide a method for forming within an integrated circuit a patterned conductor layer from a blanket conductor layer through a plasma etch method.

A second object of the present invention is to provide a method in accord with the first object of the present invention, where there is avoided plasma induced electrical discharge damage to an integrated circuit structure, such as but not limited to an integrated circuit layer or an integrated circuit device, formed beneath the blanket conductor layer when the blanket conductor layer is patterned to form the patterned conductor layer through the plasma etch method.

A third object of the present invention is to provide a method in accord with the first object of the present invention and the second object of the present invention, where the patterned conductor layer is a gate electrode within a field effect transistor (FET) and where there is avoided plasma induced electrical discharge damage to a gate dielectric layer formed beneath the gate electrode when the gate electrode is patterned from a blanket gate electrode material layer through the plasma etch method.

In accord with the objects of the present invention, there is provided by the present invention a method for forming within an integrated circuit a patterned conductor layer from a blanket conductor layer through a plasma etch method. To practice the method of the present invention, there is first provided a substrate. There is then formed over the substrate an integrated circuit structure. There is then formed over the substrate and the integrated circuit structure a blanket conductor layer. There is then formed upon the blanket conductor layer a patterned photoresist layer, where the patterned photoresist layer simultaneously: (1) leaves unexposed a first portion of the blanket conductor layer sufficiently large; and (2) leaves exposed a second portion of the blanket conductor layer sufficiently small, to limit plasma induced electrical discharge damage to the integrated circuit structure formed beneath the blanket conductor layer when the blanket conductor layer is patterned to form a patterned conductor layer through a plasma etch method. Finally, there is etched through the plasma etch method while employing the patterned photoresist layer as an etch mask layer the blanket conductor layer to form the patterned conductor layer. The integrated circuit structure may include, but is not limited to integrated circuit layers and integrated circuit devices.

There is provided by the present invention a method for forming within an integrated circuit a patterned conductor layer from a blanket conductor layer through a plasma etch method, where there is avoided plasma induced electrical discharge damage to an integrated circuit structure formed beneath the blanket conductor layer when the blanket conductor layer is patterned to form the patterned conductor layer through the plasma etch method. By forming through the method of the present invention a patterned photoresist layer upon the blanket conductor layer, where the patterned photoresist layer simultaneously: (1) leaves unexposed a first portion of the blanket conductor layer sufficiently large; and (2) leaves exposed a second portion of the blanket conductor layer sufficiently small, to limit plasma induced electrical discharge damage to an integrated circuit structure formed beneath the blanket conductor layer when the blanket conductor layer is patterned to form a patterned conductor layer through a plasma etch method, there is provided by the method of the present invention a method for forming within an integrated circuit a patterned conductor layer from a blanket conductor layer through a plasma etch method, where there is avoided plasma induced electrical discharge damage to an integrated circuit structure formed beneath the blanket conductor layer when the blanket conductor layer is patterned to form the patterned conductor layer through the plasma etch method.

The method of the present invention may be employed where the patterned conductor layer is a gate electrode and where there is avoided plasma induced electrical discharge damage to a gate dielectric layer formed beneath the gate electrode when the gate electrode is patterned from a blanket gate electrode material layer through the plasma etch method. The method of the present invention does not discriminate with respect to the nature of the integrated circuit structure which is formed beneath the blanket conductor layer which is patterned into the patterned conductor layer through the plasma etch method. Thus, the method of the present invention may be employed in avoiding plasma induced electrical discharge damage to a gate dielectric layer when forming through a plasma etch method a gate electrode from a blanket gate electrode material layer, where the gate electrode is employed within a field effect transistor (FET) for use within an integrated circuit. Similarly, the method of the present invention may also be employed in avoiding plasma induced electrical discharge damage to an integrated circuit structure formed beneath a blanket conductor layer other than a blanket gate electrode material layer, when the blanket conductor layer is patterned to form a patterned conductor layer through a plasma etch method. In such cases, the patterned conductor layer will typically provide an electrical connection to an electrode within an integrated circuit device employed within an integrated circuit, such as a gate electrode employed within a field effect transistor (FET).

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 to FIG. 3 show a series of schematic cross-sectional diagrams illustrating charge flow and dissipation incident to forming a gate electrode from a blanket gate electrode material layer through a plasma etch method conventional in the art.

FIG. 4 and FIG. 5 show a pair of schematic cross-sectional diagrams illustrating a patterned conductor layer of the prior art and a patterned conductor layer formed through the method of the present invention.

DESCRIPTION OF THE PREFERRED EMBODIMENT

Figure 6:
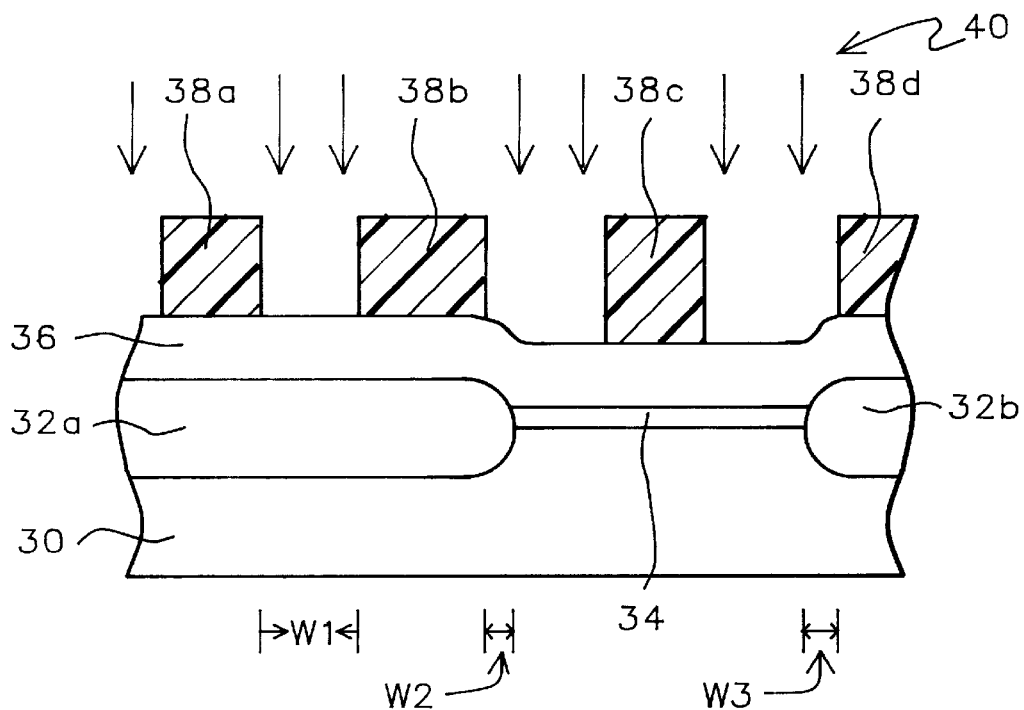
FIG. 6 to FIG. 10 show a series of schematic cross-sectional diagrams illustrating the results of progressive stages in successively forming within an integrated circuit: (1) a gate electrode from a blanket gate electrode material layer; and (2) two successively overlying patterned conductor layers from two successively overlying blanket conductor layers, through three separate plasma etch methods employed within the preferred embodiment of the method of the present invention.

The present invention provides a method for forming for use within an integrated circuit a patterned conductor layer from a blanket conductor layer through a plasma etch method, where there is avoided when forming the patterned conductor layer from the blanket conductor layer through the plasma etch method plasma induced electrical discharge damage to an integrated circuit structure formed beneath the blanket conductor layer. The integrated circuit structure may include, but is not limited to an integrated circuit layer or an integrated circuit device. The method of the present invention achieves this goal through forming upon the blanket conductor layer a patterned photoresist layer, where the patterned photoresist layer simultaneously: (1) leaves unexposed a first portion of the blanket conductor layer sufficiently large; and (2) leaves exposed a second portion of the blanket conductor layer sufficiently small, to avoid plasma induced electrical discharge damage to the integrated circuit structure when the patterned conductor layer is formed from the blanket conductor layer through the plasma etch method. Shown in FIG. 4 and FIG. 5 are schematic cross-sectional diagrams of patterned conductor layers formed through a method conventional in the art and the method of the present invention.

Shown in FIG. 4 are patterned conductor layers 24a, 24b, 24c and 24d formed upon a substrate 22 through a method conventional in the art. Shown in FIG. 5 are patterned conductor layers 24a, 24b, 24c and 24d formed upon a substrate 22 through the method of the present invention where there is also simultaneously formed dummy patterned conductor layers 26a and 26b upon the substrate. The dummy patterned conductor layers 26a and 26b result from leaving exposed a second portion of a blanket conductor layer sufficiently small to avoid plasma induced electrical discharge damage to integrated circuit structures when forming the patterned conductor layers 24a, 24b, 24c and 24d.

For a general embodiment of the method of the present invention, the blanket conductor layer may be formed from a conductive material chosen from the group of conductive materials including but not limited to metals, metal alloys, highly doped polysilicon (ie: greater that about 10E19–10E20 dopant atoms per cubic centimeter polysilicon) and polycides (highly doped polysilicon/metal silicide stacks). Typically and preferably, the blanket conductor layer will in general have a thickness of from about 1000 to about 10000 angstroms. In addition, for the general embodiment of the method of the present invention, the integrated circuit structure formed beneath the blanket conductor layer may comprise integrated circuit layers including but not limited to dielectric layers, semiconductor layers and photoactive layers. Typically and preferably, such integrated circuit layers will have a thickness of from about 20 to about 10000 angstroms.

The method of the present invention may be employed in forming within various types of integrated circuits patterned conductor layers from blanket conductor layers through plasma etch methods. The method of the present invention may be employed in forming patterned conductor layers from blanket conductor layers through plasma etch methods within integrated circuits including but not limited to dynamic random access memory (DRAM) integrated circuits, static random access memory (SRAM) integrated circuits, application specific integrated circuits (ASICs), integrated circuits having within their fabrications field effect transistors (FETs), integrated circuits having within their fabrications bipolar transistors and integrated circuits having within their fabrications bipolar complementary metal oxide semiconductor (BiCMOS) transistors.

Referring now to FIG. 6 to FIG. 10, there is shown a series of schematic cross-sectional diagrams illustrating the results of progressive process stages in forming within an integrated circuit: (1) a gate electrode from a blanket gate electrode material layer; and (2) two successively overlying patterned conductor layers from two successively overlying blanket conductor layers, through three separate plasma etch methods employed within the preferred embodiment of the method of the present invention. Shown in FIG. 6 is a schematic cross-sectional diagram of the integrated circuit at its early stages of formation.

Shown in FIG. 6 is a semiconductor substrate 30 having formed within an upon its surface a pair of isolation regions 32a and 32b which define the active region of the semiconductor substrate 30. Although semiconductor substrates are known in the art with either dopant polarity, various dopant concentrations and several crystallographic orientations, the semiconductor substrate 30 employed within the preferred embodiment of the method of the present invention is preferably a (100) silicon semiconductor substrate having an N- or P-doping. Similarly, although it is also known in the art that isolation regions may be formed within and/or upon semiconductor substrates to define active regions of those semiconductor substrates through methods including but not limited to isolation region growth methods and isolation region deposition/patterning methods, for the preferred embodiment of the method of the present invention, the isolation regions 32a and 32b are preferably formed within and upon the semiconductor substrate 30 through an isolation region thermal growth method at a temperature of from about 800 to about 1000 degrees centigrade to form isolation regions 32a and 32b of silicon oxide within and upon the semiconductor substrate 30.

There is also shown in FIG. 6 a blanket gate dielectric layer 34 formed upon the active region of the semiconductor substrate 30. Although it is known in the art that blanket gate dielectric layers may be formed upon semiconductor substrates for use within integrated circuits through methods including but not limited to blanket gate dielectric layer growth methods and blanket gate dielectric layer deposition/ patterning methods, for the preferred embodiment of the method of the present invention, the blanket gate dielectric layer 34 is preferably formed through a blanket gate dielectric layer thermal growth method at a temperature of from about 950 to about 1000 degrees centigrade to form a blanket gate dielectric layer 34 of silicon oxide upon the active region of the semiconductor substrate 30. Preferably, the blanket gate dielectric layer 34 of silicon oxide so formed has a thickness of from about 20 to about 200 angstroms.

There is also shown in FIG. 6 a blanket gate electrode material layer 36 formed upon the isolation regions 32a and 32b and the blanket gate dielectric layer 34. Within the preferred embodiment of the method of the present invention, it is desired, in part, to form through a plasma etch method from the blanket gate electrode material layer 36 a gate electrode while avoiding plasma induced electrical discharge damage to the blanket gate dielectric layer 34. Methods and materials through which blanket gate electrode material layers may be formed within integrated circuits are known in the art of integrated circuit fabrication. Blanket gate electrode material layers may be formed within integrated circuits through methods including but not limited to thermally assisted evaporation methods, chemical vapor deposition (CVD) methods and physical vapor deposition (PVD) sputtering methods through which may be formed blanket gate electrode material layers of gate electrode materials including but not limited to metals, metal alloys, highly doped polysilicon and polycides. For the preferred embodiment of the method of the present invention, the blanket gate electrode material layer 36 is preferably formed of a highly doped polysilicon or a polycide formed conformally upon the isolation regions 32a and 32b and the blanket gate dielectric layer 34 to a thickness of from about 1000 to about 4000 angstroms.

There is also shown in FIG. 6 a series of patterned first photoresist layers 38a, 38b, 38c and 38d formed upon the blanket gate electrode material layer 36. The series of patterned first photoresist layers 38a, 38b, 38c and 38d leaves unexposed a first portion of the blanket gate electrode material layer 36 and leaves exposed a second portion of the blanket gate electrode material layer 36, where the first portion of the blanket gate electrode material layer 36 is sufficiently large and the second portion of the blanket gate electrode material layer 36 is sufficiently small such that there is avoided when forming a gate electrode from the blanket gate electrode material layer 36 through a plasma etch method plasma induced electrical discharge damage to the blanket gate dielectric layer 34. Such plasma induced electrical discharge damage is avoided through the preferred embodiment of the method of the present invention when the second portion of the blanket gate electrode material layer 36 is as small as possible within the context of design rules employed in fabricating the integrated circuit whose schematic cross-sectional diagram is illustrated in FIG. 4. In order to provide the second portion of the blanket gate electrode material layer 36 as small as possible within the context of the design rules employed in fabricating the integrated circuit whose schematic cross-sectional diagram is illustrated in FIG. 4, the patterned first photoresist layers 38b and 38d define within the preferred embodiment of the method of the present invention dummy patterned gate electrode material layers.

Thus, to achieve the minimal areal dimensions of the second portion of the blanket gate electrode material layer 36 within the preferred embodiment of the method of the present invention, the patterned first photoresist layer 38b is preferably separated horizontally from the active region of the semiconductor substrate 30 by a width W2 and the patterned first photoresist layer 38d is preferably separated horizontally from the active region of the semiconductor substrate 30 by a width W3, as illustrated in FIG. 4, where W2 and W3 each are at least wide as the horizontal design rule clearance between a patterned gate electrode material layer (formed from the blanket gate electrode material layer 36) and the active region of the semiconductor substrate 30. Further, within the preferred embodiment of the method of the present invention, the patterned first photoresist layer 38a is preferably separated horizontally from the patterned first photoresist layer 38b by a width W1, where W1 is at least as wide as the design rule spacing for patterned layers which are formed from the blanket gate electrode material layer 36. When the foregoing horizontal spacing conditions are met, there will be limited electrical coupling and no electrical shorting of patterned layers formed from the blanket gate electrode material layer 36.

The patterned first photoresist layers 38a, 38b, 38c and 38d may be formed from any of several photoresist materials as are known in the art, including but not limited to positive photoresist materials and negative photoresist materials. For the preferred embodiment of the method of the present invention, the patterned first photoresist layers 38a, 38b, 38c and 38d are preferably formed of a positive photoresist material, as is common in the art, in order to assure optimal dimensional integrity of the patterned first photoresist layers 38a, 38b, 38c and 38d. Preferably, the patterned first photoresist layers 38a, 38b, 38c and 38d are from about 5000 to about 20000 angstroms thick each.

Finally, there is shown in FIG. 6 the presence of a first plasma 40 which is employed within a first plasma etch method when patterning the blanket gate electrode material layer 36 to form, among other structures within the integrated circuit whose schematic cross-sectional diagram is illustrated in FIG. 6, a gate electrode. The first plasma 40 is chosen in accord with the materials through which is formed the blanket gate electrode material layer 36. When the blanket gate electrode material layer 36 is formed of highly doped polysilicon or a polycide, the first plasma 40 preferably comprises a chlorine containing reactant gas composition, such as a chlorine and sulfur hexafluoride containing reactant gas composition. The first plasma 40 may be provided by any of several first plasma etch methods as are known in the art, including but not limited to microwave plasma etch methods, reactive ion etch (RIE) plasma etch methods, magnetically enhanced reactive ion etch (MERIE) plasma etch methods and electron cyclotron resonance (ECR) plasma etch methods. Typically and preferably, the first plasma 40 will be employed within a reactive ion etch (RIE) first plasma etch method at a power at which there is typically substantial charging of the blanket gate electrode material layer 36 when employing a plasma etch method conventional in the art which does not employ a patterned photoresist layer of areal dimensions in accord with the method of the present invention.

Figure 7:
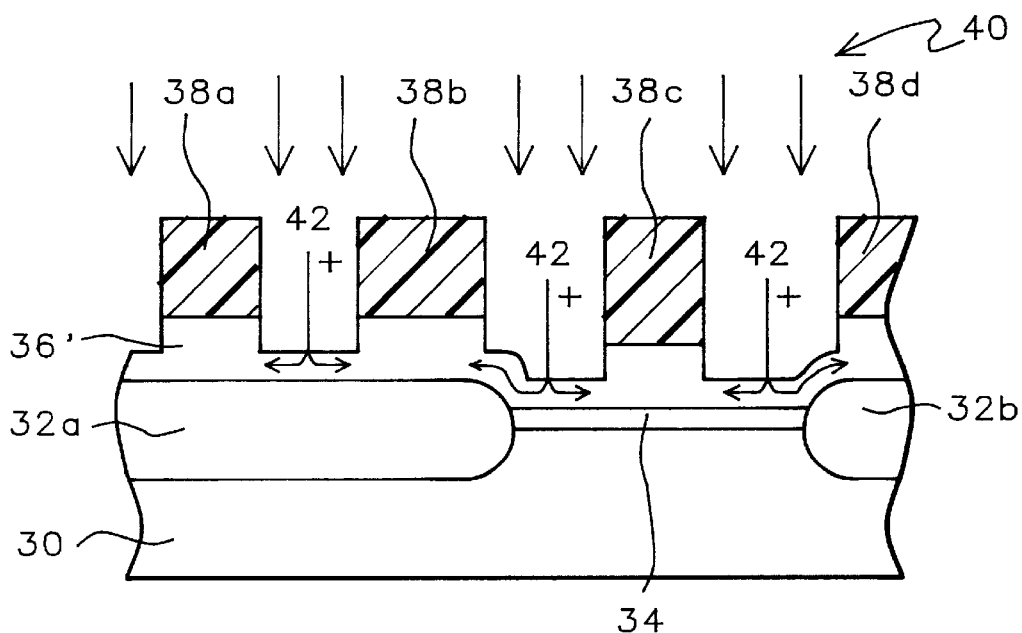

Referring now to FIG. 7, there is shown a schematic cross-sectional diagram illustrating the results of further processing of the integrated circuit whose schematic cross-sectional diagram is illustrated in FIG. 4. Shown in FIG. 5 is the results of partially patterning through the first plasma etch method employing the first plasma 40, while employing the patterned photoresist layers 38a, 38b, 38c and 38d as a photoresist etch mask layer, the blanket gate electrode material layer 36 to form the partially patterned gate electrode material layer 36'. When forming the partially patterned blanket gate electrode material layer 36' through the method of the present invention, the direction of charge flow and dissipation 42 from the first plasma 40 is, as indicated in FIG. 5, into the thicker portions of the partially patterned blanket gate electrode material layer 36' beneath the patterned first photoresist layers 38a, 38b, 38c and 38d.

Figure 8:
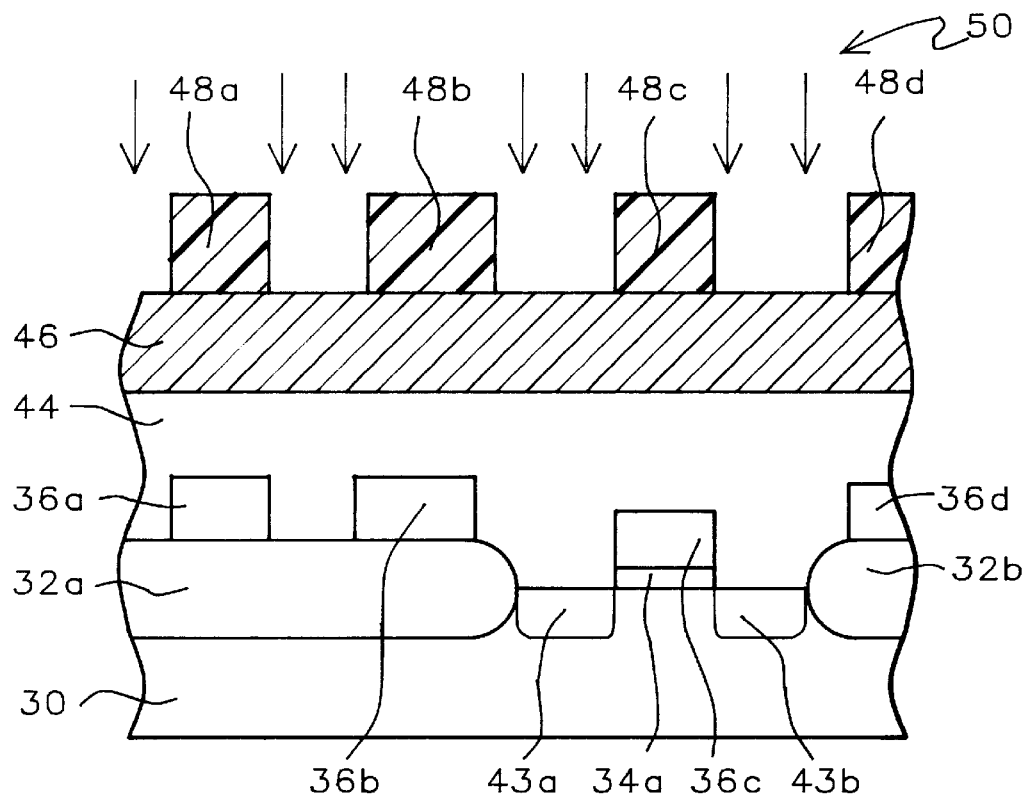

Referring now to FIG. 8, there is shown a schematic cross-sectional diagram illustrating the results of further processing of the integrated circuit whose schematic cross-sectional diagram is illustrated in FIG. 7. Shown in FIG. 8 is the results of completely patterning through the first plasma etch method employing the first plasma 40 the partially patterned blanket gate electrode material layer 36' to yield a patterned gate electrode material interconnect layer 36a, a gate electrode 36c and a pair of dummy gate electrode material layers 36b and 36d. Also shown is a gate dielectric layer 34a which results from subsequent complete patterning of the blanket gate dielectric layer 34 while employing the gate electrode 36c as an etch mask layer. From the four patterned layers derived from the blanket gate electrode material layer 36 there is then removed, preferably through a wet chemical or a dry plasma stripping method as is conventional in the art, the corresponding patterned first photoresist layers 38a, 38b, 38c and 38d. There is then formed into the active region of the semiconductor substrate 30 at areas not occupied by the gate dielectric layer 34a and the gate electrode 36c a pair of source/drain regions 43a and 43b. The pair of source/drain regions 43a and 43b is preferably formed through methods as are conventional in the art, which methods will typically employ an ion implantation method employing a dopant ion of suitable polarity to a field effect transistor (FET) desired to be formed within the active region of the semiconductor substrate 30.

There is also shown in FIG. 8 the presence of a planarized pre-metal dielectric (PMD) layer 44 formed upon the integrated circuit including the field effect transistor (FET) formed from the gate dielectric layer 34a, the gate electrode 36c and the source/drain regions 43a and 43b. Methods through which may be formed planarized dielectric layers within integrated circuits are known in the art of integrated circuit fabrication. Planarized dielectric layers are typically, although not exclusively, formed within integrated circuits through planarizing through methods as are conventional in the art of conformal dielectric layers formed within those integrated circuits. Conformal dielectric layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal dielectric layers of dielectric materials including but not limited to silicon oxide dielectric materials, silicon nitride dielectric materials and silicon oxynitride dielectric materials. For the preferred embodiment of the method of the present invention, the planarized pre-metal dielectric (PMD) layer 44 is preferably: (1) formed from a silicon oxide dielectric material deposited through a plasma enhanced chemical vapor deposition (PECVD) method; and (2) planarized through a chemical mechanical polish (CMP) planarizing method or a reactive ion etch (RIE) etchback planarizing method, as is conventional in the art.

There is also shown in FIG. 8 formed upon the planarized pre-metal dielectric (PMD) layer 44 a blanket first conductor layer 46. Methods and materials through which blanket conductor layers may be formed within integrated circuits are also known in the art of integrated circuit fabrication. Blanket conductor layers may be formed within integrated circuits through methods including but not limited to thermally assisted evaporation methods, electron beam assisted evaporation methods and physical vapor deposition (PVD) sputtering methods through which may be formed blanket conductor layers of conductor materials including but not limited to metals, metal alloys, highly doped polysilicon and polycides. For the preferred embodiment of the method of the present invention, the blanket first conductor layer 46 is preferably formed at least in part of an aluminum containing conductor material, as is common in the art.

There is also shown in FIG. 8 the presence of the patterned second photoresist layers 48a, 48b, 48c and 48d. The patterned second photoresist layers 48a, 48b, 48c and 48d are preferably formed through methods, materials and dimensions analogous or equivalent to the methods materials and dimensions through which are formed the patterned first photoresist layers 38a, 38b, 38c and 38d. Analogously to the patterned first photoresist layers 38a, 38b, 38c and 38d, the patterned second photoresist layers 48a, 48b, 48c and 48d also leave unexposed a first portion of the blanket first conductor layer 46 and leave exposed a second portion of the blanket first conductor layer 46, where the first portion of the blanket first conductor layer 46 is sufficiently large and the second portion of the blanket first conductor layer 46 is sufficiently small such that integrated circuit structures, such as but not limited to the planarized pre-metal dielectric (PMD) layer 44, formed beneath the blanket first conductor layer 46 may avoid plasma induced electrical discharge damage when the blanket first conductor layer 46 is patterned to form a patterned first conductor layer through a plasma etch method. Similarly with the blanket gate electrode material layer 36, such plasma induced electrical discharge damage is avoided through the preferred embodiment of the method of the present invention when the second portion of the blanket first conductor layer 46 is as small as possible within the context of design rules employed in fabricating the integrated circuit whose schematic cross-sectional diagram is illustrated in FIG. 8. In order to provide the second portion of the blanket first conductor layer 46 as small as possible within the context of the design rules employed in fabricating the integrated circuit whose schematic cross-sectional diagram is illustrated in FIG. 8, one or more of the patterned first photoresist layers 48a, 48b, 48c and 48d define within the preferred embodiment of the method of the present invention dummy patterned first conductor layers.

Analogously with the patterned first photoresist layers 38a and 38b, each of the patterned second photoresist layers 48a, 48b, 48c and 48d is separated from an adjoining patterned second photoresist layer by a width greater than the design rule spacing for a patterned first conductor layer formed from the blanket first conductor layer 46.

Finally, there is also shown in FIG. 8 the presence of a second plasma 50. The second plasma 50 is employed within a second plasma etch method, while employing the patterned second photoresist layers 48a, 48b, 48c and 48d as etch mask layers, in patterning the blanket first conductor layer 46 to form a series of patterned first conductor layers. The second plasma 50 is preferably formed through methods, materials and conditions analogous or equivalent to the methods, materials and conditions employed in forming the first plasma 40, with the exception that the reactant gas composition employed within the second plasma 50 is preferably adjusted appropriately to the conductor material from which is formed the blanket first conductor layer 46.

Figure 9:
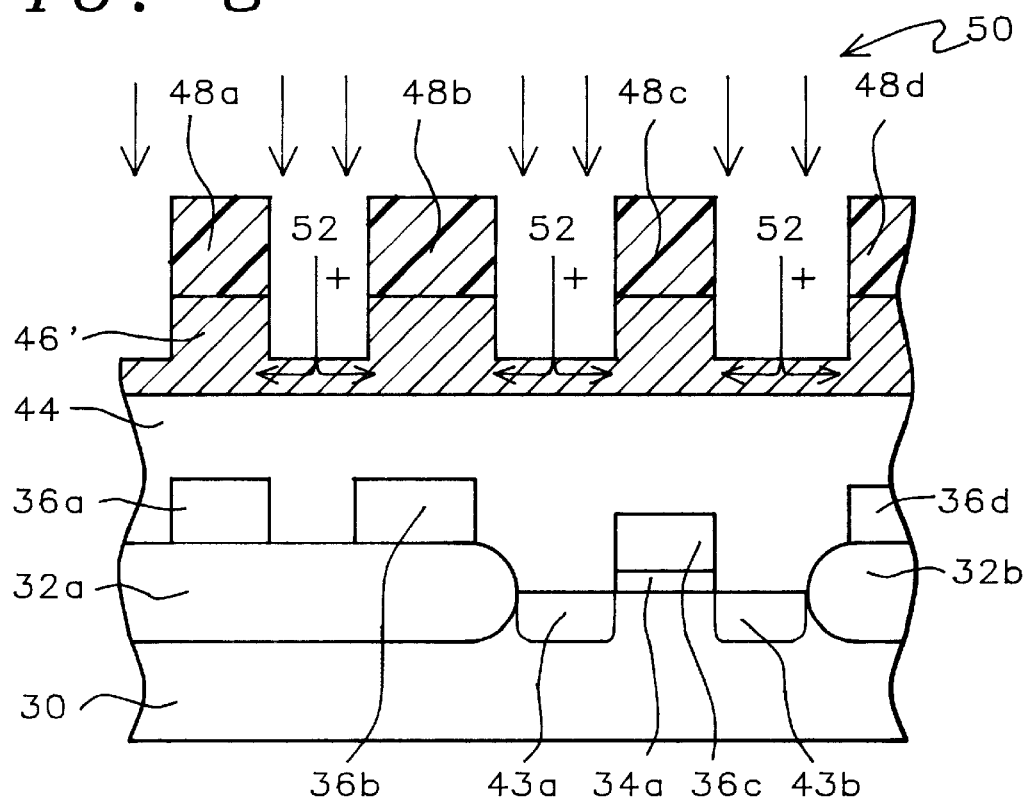

Referring now to FIG. 9, there is shown a schematic cross-sectional diagram illustrating the results of further processing of the integrated circuit whose schematic cross-sectional diagram is illustrated in FIG. 8. Shown in FIG. 9 is the results of patterning through the second plasma 50, while employing the patterned second photoresist layers 48a, 48b, 48c and 48d as etch mask layers, the blanket first conductor layer 46 to form the partially patterned blanket first conductor layer 46'. Analogously to the method through which the direction of charge flow and dissipation 42 from the first plasma 40 is into portions of the partially patterned blanket gate electrode material layer 36', rather than through the blanket gate dielectric layer 34, the direction of charge flow and dissipation 52 from the second plasma 50 is into portions of the partially patterned blanket first conductor layer 46' beneath the patterned second photoresist layers 48a, 48b, 48c and 48d rather than through the planarized pre-metal dielectric (PMD) layer 44 or any integrated circuit structures formed beneath the blanket first conductor layer 46. Thus, there is avoided plasma induced electrical discharge damage to integrated circuit structures formed beneath the blanket first conductor layer 46.

As is understood by a person skilled in the art, the method of the present invention may be employed in avoiding plasma induced electrical discharge damage to integrated circuit structures formed beneath blanket conductor layers within integrated circuits other than blanket gate electrode material layers and blanket first conductor layers, when those other blanket conductor layers are patterned through plasma etch methods to form other patterned conductor layers. In that regard, there is shown by reference to FIG. 10 a schematic cross-sectional diagram of an integrated circuit having formed therein a partially patterned blanket second conductor layer which is being patterned through the method of the present invention while avoiding plasma induced electrical discharge damage to integrated circuit structures formed beneath the partially patterned blanket second conductor layer.

Figure 10:
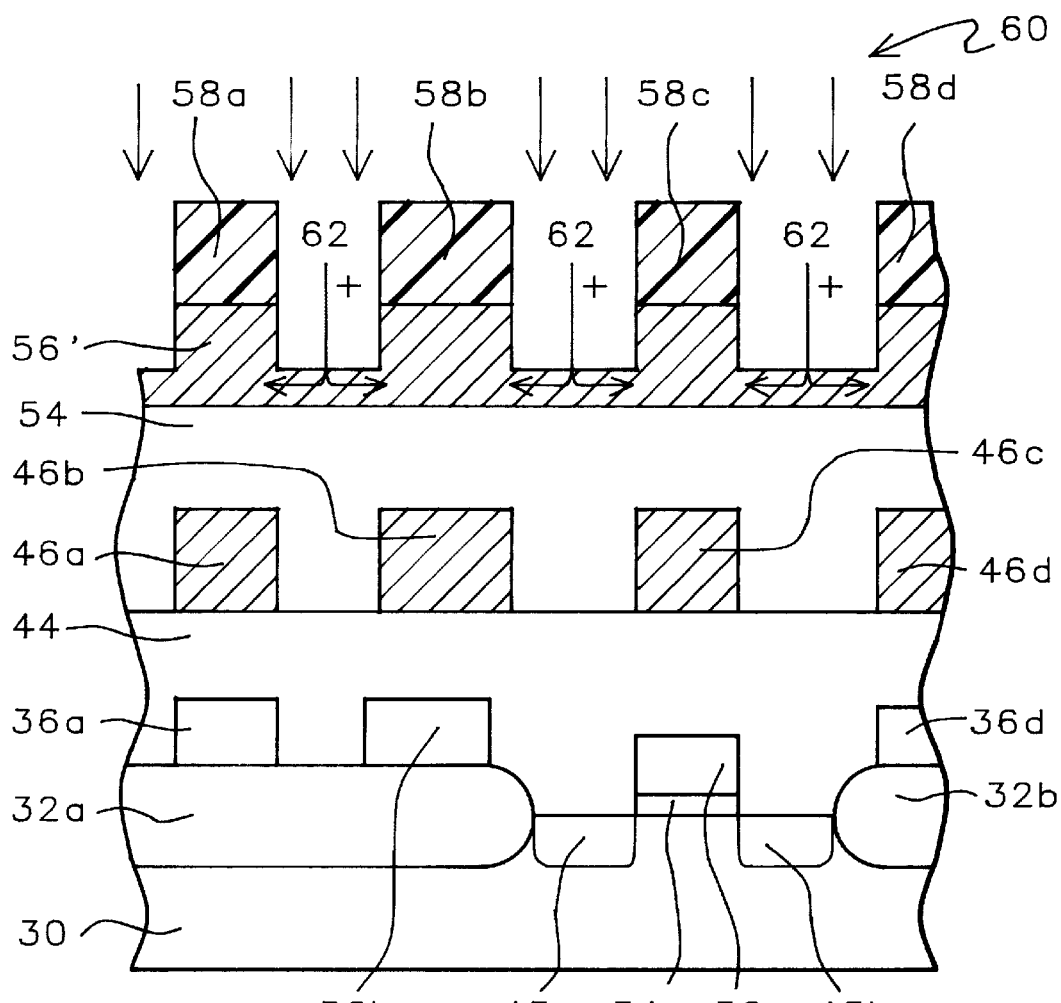

First, there is shown in FIG. 10 the presence of a series of patterned first conductor layers 46a, 46b, 46c and 46d which are formed through completely patterning through the second plasma etch method employing the second plasma 50, while employing the patterned second photoresist layers 48a, 48b, 48c and 48d as photoresist etch mask layers, the partially patterned blanket first conductor layer 46'. There is then removed, preferably through a wet chemical or a dry plasma photoresist stripping method as is conventional in the art, the patterned second photoresist layers 48a, 48b, 48c and 48d from the corresponding patterned first conductor layers 46a, 46b, 46c and 46d.

Formed then upon the integrated circuit is a planarized inter-metal dielectric (IMD) layer 54. Preferably, the planarized inter-metal dielectric (IMD) layer 54 is formed through methods, materials and dimensions analogous or equivalent to the methods materials and dimensions employed in forming the planarized pre-metal dielectric (PMD) layer 44. There is then formed upon the planarized inter-metal dielectric (IMD) layer 54 a blanket second conductor layer (not shown) and, finally, there is formed upon the blanket second conductor layer a series of patterned third photoresist layers 58a, 58b, 58c and 58d, as illustrated in FIG. 10. The patterned third photoresist layers 58a, 58b, 58c and 58d are preferably formed through methods, materials and dimensions analogous or equivalent to the methods, materials and dimensions employed in forming the patterned second photoresist layers 48a, 48b, 48c and 48d.

Finally, there is shown in FIG. 10 the results of patterning through a third plasma etch method employing a third plasma 60 the blanket second conductor layer while employing the patterned third photoresist layers 58a, 58b, 58c and 58d as photoresist etch mask layers, to form a partially patterned blanket second conductor layer 56'. Analogously with the direction of charge flow and dissipation 52 from the second plasma 50 into the thicker portions of the partially patterned blanket first conductor layer 46', the method of the present invention also provides for the direction of charge flow and dissipation 62 from the third plasma 60 into the thicker portions of the partially patterned blanket second conductor layer 56' formed beneath the patterned third photoresist layers 58a, 58b, 58c and 58d. By providing a direction of charge flow and dissipation 62 from the third plasma 60 into the thicker portions of the partially patterned blanket second conductor layer 56', there is avoided through the method of the present invention plasma induced electrical discharge damage to the planarized inter-metal dielectric (IMD) layer 54 or any other integrated circuit structures formed beneath the blanket second conductor layer.

As is understood by a person skilled in the art, the general embodiment and the preferred embodiment of the method of the present invention are illustrative of the present invention rather than limiting of the present invention. Revisions may be made to methods, materials, structures and dimensions through which is provided the general embodiment and the preferred embodiment of the method of the present invention while providing an embodiment which is within the spirit and scope of the method of the present invention, as defined by the accompanying claims.

What is claimed is:

1. A method for forming within an integrated circuit a patterned conductor layer from a blanket conductor layer through a plasma etch method comprising:

providing a substrate;

forming over the substrate an integrated circuit structure;

forming over the substrate and the integrated circuit structure a blanket conductor layer;

forming upon the blanket conductor layer a patterned photoresist layer, the patterned photoresist layer simultaneously leaving unexposed a first portion of the blanket conductor layer sufficiently large and leaving exposed a second portion of the blanket conductor layer sufficiently small to avoid plasma induced electrical discharge damage to the integrated circuit structure when the blanket conductor layer is patterned to form a patterned conductor layer through a plasma etch method; and etching through the plasma etch method while employing the patterned photoresist layer as an etch mask layer the blanket conductor layer to form the patterned conductor layer.

2. The method of claim 1 wherein when the blanket conductor layer is etched to form the patterned conductor layer there is formed a dummy patterned conductor layer from the first portion of the blanket conductor layer.

3. The method of claim 1 wherein the integrated circuit structure is formed from a structure chosen from the group of structures consisting of integrated circuit layers and integrated circuit devices.

4. The method of claim 3 wherein the integrated circuit layers are chosen from the group of integrated circuit layers consisting of dielectric layers, semiconductor layers and photoactive layers.

5. The method of claim 4 wherein the integrated circuit layers are from about 20 to about 10000 angstroms thick.

6. The method of claim 1 wherein the blanket conductor layer is formed from a conductor material chosen from the group of conductor materials consisting of metals, metal alloys, highly doped polysilicon and polycides.

7. The method of claim 6 wherein the blanket conductor layer is from about 1000 to about 10000 angstroms thick.

8. The method of claim 1 wherein the plasma etch method is chosen from the group of plasma etch methods consisting of microwave plasma etch methods, reactive ion etch (RIE) plasma etch methods, magnetically enhanced reactive ion etch (MERIE) plasma etch methods and electron cyclotron resonance (ECR) plasma etch methods.

9. A plasma etch method for forming for use within a field effect transistor within an integrated circuit a gate electrode comprising:

providing a semiconductor substrate;

forming upon the semiconductor substrate a gate dielectric layer;

forming upon the gate dielectric layer a blanket gate electrode material layer;

forming upon the blanket gate electrode material layer a patterned photoresist layer, the patterned photoresist layer simultaneously leaving unexposed a first portion of the blanket gate electrode material layer sufficiently large and leaving exposed a second portion of the blanket gate electrode material layer sufficiently small to avoid plasma induced electrical discharge damage to the gate dielectric layer when the blanket gate electrode material layer is patterned to form a gate electrode through a plasma etch method; and etching through the plasma etch method while employing the patterned photoresist layer as an etch mask layer the blanket gate electrode material layer to form the gate electrode.

10. The method of claim 9 wherein when the blanket gate electrode material layer is etched to form the gate electrode there is simultaneously formed a dummy patterned gate electrode material layer from the first portion of the blanket gate electrode material layer.

11. The method of claim 9 wherein the gate dielectric layer is formed from a silicon oxide dielectric material at a thickness of from about 20 to about 200 angstroms.

12. The method of claim 9 wherein the blanket gate electrode material layer is formed from a gate electrode material chosen from the group of gate electrode materials consisting of highly doped polysilicon and polycide gate electrode materials.

13. The method of claim 12 wherein the blanket gate electrode material layer is from about 1000 to about 4000 angstroms thick.

14. The method of claim 9 wherein the plasma etch method is chosen from the group of plasma etch methods consisting of microwave plasma etch methods, reactive ion etch (RIE) plasma etch methods, magnetically enhanced reactive ion etch (MERIE) plasma etch methods and electron cyclotron resonance (ECR) plasma etch methods.

* * * * *